United States Patent Office
3,694,368
Patented Sept. 26, 1972

3,694,368
TERNARY AZEOTROPIC COMPOSITIONS
Oliver A. Barton, Florham Park, N.J., and Kevin P. Murphy, Orchard Park, N.Y., assignors to Allied Chemical Corporation, New York, N.Y.
No Drawing. Filed Feb. 26, 1971, Ser. No. 119,372
Int. Cl. C11d 3/44
U.S. Cl. 252—171 4 Claims

ABSTRACT OF THE DISCLOSURE

Certain ternary mixtures of tetrachlorodifluoroethane (sym-, asym-, and mixtures thereof) isopropanol and nitromethane are useful as solvents to remove rosin fluxes from printed circuit boards containing the same. These mixtures are useful not only because of their high solvency characteristics but also because they exhibit essentially the constant boiling characteristics of a ternary azeotrope which is formed between these components, thereby facilitating handling and purification of the solvent mixtures without significantly altering their compositions. The ternary mixtures disclosed herein exhibit substantially higher solvency characteristics for rosin fluxes than the pure solvents, tetrachlorodifluoroethane, isopropanol or nitromethane.

BACKGROUND OF THE INVENTION

The electronic industry has sought for solvents which can efficiently remove rosin fluxes from printed circuit boards containing the same. The rosin fluxes are intentionally deposited on the surface of the circuit boards prior to soldering on electronic components, but must be removed after soldering in order to achieve maximum reliability of the printed circuits. The solvent must not only be highly effective for removing the undesired rosin flux but must, for commercial applications, be stable, and inert towards the electronic components on the circuit board itself.

A variety of solvents have been tested for such purposes but generally have been found to be lacking, to a greater or lesser extent, one or more of the above described properties. For example, whereas highly chlorinated solvents, such as $CH_2Cl_2$ and $CHCl_3$, are highly effective for the removal of rosin flux; such solvents, when used alone, attack the electronic components on the circuit board. Such solvents also require the addition of a stabilizer to prevent decomposition. A variety of non-constant boiling mixtures have been employed to achieve the desired solvency, while retaining the desired inertness towards the electrical components. Preferential evaporation of the more volatile component of such mixtures, however, can result in mixtures having less desirable properties, such as lower solvency for rosin fluxes, less inertness towards the electrical components and increased flammability.

A number of binary azeotropic (constant boiling) mixtures have been employed for the purpose of cleaning electrical circuits, which afford many of the advantages obtainable with solvent mixtures, but which do not suffer from the above described major disadvantage possessed by non-constant boiling solvent mixtures. Illustrative of such binary azeotropic systems are the azeotrope of 1,1,2-trichlorotrifluoroethane and methylene chloride, B.P. 37° C. at 760 mm. pressure (U.S.P. 2,999,817) and the binary azeotrope of 1,1,2-trichlorotrifluoroethane and methyl alcohol, B.P. 39° C. at 760 mm. pressure (U.S.P. 2,999,816). Unfortunately, however, the solvencies of these binary azeotropic compositions for the common rosin fluxes which are employed in the manufacture of printed circuits, are not as high as might be desired and the solvents either leave deposits on the boards or become cloudy after use.

SUMMARY OF THE INVENTION

It is accordingly the major object of this invention to provide constant boiling or essentially constant boiling compositions which, while meeting the requirements of inertness to electronic components; posses particularly high solvency towards the resin fluxes which are commonly used in the manufacture of printed electrical circuits and which therefore permit repeated cleaning treatments of such electrical circuits without significant redeposition of the flux upon the surface of the printed circuits upon removal of the solvent by evaporation.

Another object of the invention is to provide novel, constant boiling or essentially constant boiling compositions of matter which do not substantially change composition upon evaporation.

The present invention is directed to constant boiling compositions, and particularly to a ternary azeotropic composition, and equivalent mixtures, which possess enhanced solvency for polymeric compounds, particularly rosin solder fluxes used in the manufacture of printed circuit boards. The novel ternary azeotropic composition is a constant boiling mixture which contains about 67 weight percent of tetrachlorodifluoroethane, about 22.2 weight percent of isopropanol and about 10.8 weight percent of nitromethane. The composition of this mixture may be varied somewhat without altering the essential azeotropic nature or constant boiling characteristic of the same, or the solvency characteristics of the same.

It has also been found that this azeotropic mixture is inert to electronic components on printed circuit boards and that it exhibits unusually high solvency towards rosin fluxes which are commonly employed in the manufacture of such boards. As a consequence, samples of the novel azeotropic composition may be employed repeatedly and effectively as solvents to remove such rosin fluxes and upon evaporation leave no perceptible residues. Moreover, the solvent solutions remain clear even after repeated use. Since the azeotrope boils at a constant temperature, evaporation or distillation of the azeotrope in whole or in part does not change the composition of the liquid mixture. This is significant since it enables the azeotropic mixture to be handled and purified without the adverse effect of having its composition change as would occur with a non-azeotropic mixture.

The tetrachlorodifluoroethane component is available commercially. This material, as sold commercially, is a mixture of the symmertical isomer, 1,1,2,2-tetrachloro-1,2-difluoroethane, and the asymmetrical isomer, 1,1,1,2-tetrachloro-2,2-difluoroethane, in the ratio of approximately 69 mol percent and 31 mol percent, respectively. We have found that either the pure isomers or mixtures thereof form minimum boiling azeotropes with isopropanol and nitromethane having approximately the same composition, boiling point, and properties. Accordingly our invention includes the ternary azeotrope derived from either the symmetrical or asymmetrical tetrachlorodifluoroethane or mixtures thereof. A suitable grade for the mixture of isomers of tetrachlorodifluoroethane is sold by Allied Chemical under the trademark "Genetron 112." Further reference in this specification and the claims appended hereto, unless otherwise indicated, to "tetrachlorodifluoroethane" is intended to include the pure isomers and/or any mixtures thereof.

In the following examples parts and percentages are by weight and temperatures are given in degrees centigrade, unless otherwise specified.

EXAMPLE 1

Preparation of ternary azeotrope (A) A mixture of equimolecular proportions of tetrachlorodifluoroethane (the commercial mixture of the isomers, B.P. 92.8°), isopropanol (B.P. 82.0°), and nitromethane (B.P. 101.5°), was charged to a still and heated therein to reflux. The mass was then distilled. A constant boiling fraction at about 74° was collected and found to contain all three components. This fraction was redistilled and analyzed by gas chromatography. The composition of the azeotrope was found to be:

| | Percent |
|---|---|
| Tetrachlorodifluoroethane | 67.0 |
| Isopropanol | 22.2 |
| Nitromethane | 10.8 |

The boiling point of this azeotrope was 74.6° at 760 mm. pressure.

(B) The procedure of part A above was repeated using in place of the commercially available mixture of tetrachlorodifluoroethane isomers an equivalent amount of the pure (97 mol percent) asymmetrical isomer. A ternary azeotrope of essentially the same percentage composition was obtained. The boiling point of this azeotrope was 74.7° at 760 mm. pressure.

(C) The procedure of part A above was repeated using in place of the mixture of tetrachlorodifluoroethane isomers, an equivalent amount of the pure (99 mol percent) symmetrical isomer. A ternary azeotrope of essentially the same percentage composition was obtained. The boiling point of this azeotrope was 74.2° at 760 mm. pressure.

EXAMPLE 2

In the manufacture of printed circuit boards, the desired electrical circuit is etched on a copper clad phenolic or epoxy resin laminated board and the laminate is coated with a rosin solder flux. After the coating has been dried, the board is passed through a molten solder bath wherein the circuit joints are contacted by the molten metal and soldering of the joints is accomplished. After cooling, the excess rosin flux remaining on the board must be removed, since if such be present in the final assembly, it will lead to corrosion, poor electrical resistance and other adverse effects.

In order to demonstrate the effectiveness of the azeotropes of our invention as solvents for rosin solder fluxes used in the preparation of printed circuit boards, the following test was carried out.

An amount of a commercially available rosin solder flux, Kester No. 1544 (the trade designation of a rosin solder flux available from Kester Solder Company. This product is said to contain as a major ingredient some form of pine tree gum, containing abietic acid and related substances) was heated at 260° for 24 seconds. The cured rosin solder flux was cooled and then ground to a fine powder. Five parts of a test solvent was heated to 75°, the usual temperature of vapor cleaning baths, and agitated at that temperature while small increments of the powdered cured rosin solder flux were added to the hot test solvent. The solvency endpoint of the test was reached when a persistent cloud of insolubles was attained.

In order to compare the solvency power of the ternary azeotrope of our invention with the individual components thereof the solubility of the cured rosin solder flux was determined in each of these solvents and the azeotropic mixture thereof, by the above described test method. The results obtained were as follows:

| | Wt. percent |
|---|---|
| Tetrachlorodifluoroethane | 0.74 |
| Isopropanol | 7.5 |
| Nitromethane | 1.3 |
| Azeotrope | 9.7 |

These results indicate the surprising greater solvency power of the azeotrope as compared with the individual components thereof. Moreover, the solvency power of the azeotrope for the rosin solder flux is more than twice that which would be expected from the sum of the solvency power of the individual components indicating the presence of a synergistic solvency characteristic in the azeotropic mixture.

EXAMPLE 3

To simulate actual manufacturing practice and to determine the precise rate of removal of rosin solder flux from an inert substrate, aluminum sheets, 1/3" x 1" x 2", were coated with a commercially available rosin solder flux and the coated sheets were heated in an oven at 204.4° for five minutes. After cooling, the coated sheets were exposed to refluxing vapors of various solvents and the length of time required to clean the coated sheets determined. The results of these tests are set out in the following table.

TABLE

| Solvent | Reflux temp., ° | Wt. of flux in grams | Time of removal, seconds | Description of substrate |
|---|---|---|---|---|
| Nitromethane | 101.2 | 0.0267 | 240 | Plainly visible wax-like film over much of sheet. 1.2% by wt. of coating remaining. |
| Isopropanol | 82.0 | 0.0250 | 100 | Clean. |
| Tetrachlorodifluoroethane | 92.8 | 0.0243 | 120 | Do. |
| Azeotrope | 76.4 | 0.0250 | 18 | Do. |

These data clearly indicate the superior solvency power of the azeotrope of our invention compared with that of the individual solvents contained in the azeotropic mixture. They clearly indicate, also, the synergistic solvent effect of the azeotrope with respect to the dissolution of rosin solder flux.

The azeotropes, being constant boiling, can be efficiently handled at the temperature of the bath without the preferential loss of one component (i.e. they do not fractionate). Non-azeotropic solvent mixtures, because of losses of one or more of the components of the solvent mixture by evaporation during use, can not be reclaimed intact by conventional rectification.

The novel azeotropes of the invention find other solvent applications such as for removing gases and oils from a variety of industrial items, for the cleaning of photographic films and prints, for the removal of buffing compounds, such as rouge, and also may be used as heat exchange media, electrical transfer media, chemical reaction media, and as hydraulic fluids.

It will be apparent to those skilled in the art that for specialized purposes, various additives could be incorporated with the novel solvent mixtures of the invention, for example, lubricants, detergents, and the like. These additives are chosen so as not to adversely alter the essential properties of the mixture for a given application.

The invention is not intended to be limited by any specific embodiments disclosed herein but only by the scope of the following claims.

We claim:

1. A constant boiling mixture of tetrachlorodifluoroethane, isopropanol and nitromethane which when distilled at a pressure of 760 mm. consists essentially of about 67 weight percent of tetrachlorodifluoroethane about 22.2 weight percent of isopropanol and about 10.8 weight percent of nitromethane.

2. A mixture as defined in claim 1 in which the tetrachlorodifluoroethane is a mixture of about 69 mol percent of 1,1,2,2-tetrachloro-1,2-difluoroethane and about 31 mol percent of 1,1,1,2-tetrachloro-2,2-difluoroethane.

3. A mixture as defined in claim 1, in which the tetrachlorodifluoroethane is substantially pure 1,1,2,2-tetrachloro-1,2-difluoroethane.

4. A mixture as defined in claim 1, in which the tetrachlorodifluoroethane is substantially pure 1,1,1,2-tetrachloro-2,2-difluoroethane.

References Cited

UNITED STATES PATENTS

| | | | |
|---|---|---|---|
| 3,085,116 | 4/1963 | Kvalnes | 252—171 |
| 3,530,073 | 9/1970 | Clark et al. | 252—DIG. 9 |

LEON D. ROSDOL, Primary Examiner

W. E. SCULZ, Assistant Examiner

U.S. Cl. X.R.

252—DIG. 9